US006248675B1

United States Patent
Xiang et al.

(10) Patent No.: US 6,248,675 B1
(45) Date of Patent: Jun. 19, 2001

(54) FABRICATION OF FIELD EFFECT TRANSISTORS HAVING DUAL GATES WITH GATE DIELECTRICS OF HIGH DIELECTRIC CONSTANT USING LOWERED TEMPERATURES

(75) Inventors: Qi Xiang, Santa Clara; Ming-Ren Lin, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/369,099

(22) Filed: Aug. 5, 1999

(51) Int. Cl.$^7$ .................................................. H01L 21/302
(52) U.S. Cl. ........................ 438/926; 438/166; 438/287; 438/704; 438/722
(58) Field of Search ................................... 438/166, 287, 438/926, 692, 704, 722, 721

(56) References Cited

U.S. PATENT DOCUMENTS 6,087,231 * 7/2000 Xiang et al. ......................... 438/287
6,159,782 * 12/2000 Xiang et al. ......................... 438/197

OTHER PUBLICATIONS

Seok–Woon Lee and Seung–Ki Joo, *Low Temperature Poly–Si Thin–Film Transistor Fabrication by Metal–Induced Lateral Crystallization*, IEEE Electron Devices Letters, vol. 17, No. 4, Apr., 1996, pp. 160–162.

A. Chatterjee et al., *Sub–100nm Gate Length Metal Gate NMOS Transistors Fabricated by a Replacement Gate Process*, IEDM, 1997, pp. 821–824.

J. Bevk et al., *Buried Ultra–Low–Energy Gate Implants for Sub–0.25micron CMOS Technology*, Symposium on VLSI Technology Digest of Technical Papers, 1998, pp. 74–75.

* cited by examiner

Primary Examiner—Gregory Mills
Assistant Examiner—George Goudreau
(74) Attorney, Agent, or Firm—Monica H. Choi

(57) ABSTRACT

A method for fabricating short channel field effect transistors with dual gates and with a gate dielectric having a high dielectric constant. The field effect transistor is initially fabricated to have a sacrificial gate dielectric and a dummy gate electrode. Any fabrication process, such as an activation anneal or a salicidation anneal of the source and drain of the field effect transistor, using relatively high temperature is performed with the field effect transistor having the sacrificial gate dielectric and the dummy gate electrode. The dummy gate electrode and the sacrificial gate dielectric are etched from the field effect transistor to form a gate opening. A layer of dielectric with high dielectric constant is deposited on the side wall and the bottom wall of the gate opening, and a crystallization enhancing layer is deposited on the bottom wall of the gate opening. Amorphous gate electrode material, such as amorphous silicon, is deposited to fill the gate opening after the crystallization enhancing layer has been deposited. Dual gates for both an N-channel field effect transistor and a P-channel field effect transistor are formed by doping the amorphous gate electrode material with an N-type dopant for an N-channel field effect transistor, and by doping the amorphous gate electrode material with a P-type dopant for a P-channel field effect transistor. The amorphous gate electrode material in the gate opening is then annealed at a relatively low temperature, such as 500° Celsius, using an enhanced crystallization process to convert the amorphous gate electrode material, such as amorphous silicon, into polycrystalline gate electrode material, such as polycrystalline silicon. Thus, relatively low temperatures are used in the present invention to preserve the integrity of the gate dielectric having the high dielectric constant.

18 Claims, 4 Drawing Sheets

FABRICATION OF FIELD EFFECT TRANSISTORS HAVING DUAL GATES WITH GATE DIELECTRICS OF HIGH DIELECTRIC CONSTANT USING LOWERED TEMPERATURES

TECHNICAL FIELD

The present invention relates generally to field effect transistors such as MOSFETs (Metal Oxide Semiconductor Field Effect Transistors), and more particularly, to a method for fabrication of dual gates of field effect transistors with gate dielectrics of high dielectric constant using lowered temperatures to preserve the integrity of the gate dielectrics.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Field effect transistors, such as MOSFETs (Metal Oxide Semiconductor Field Effect Transistors), are now widely used within integrated circuits. As the dimensions of the MOSFET are further scaled down to submicron and nanometer dimensions, the thickness of the gate oxide of the MOSFET is also scaled down accordingly. However, a thin gate oxide for a MOSFET of submicron and nanometer dimensions is leaky due to charge carrier tunneling and leads to faster degradation of the MOSFET. Thus, an alternative gate dielectric having a high dielectric constant, such as a metal oxide, is used to replace the gate oxide for a MOSFET of submicron and nanometer dimensions.

A gate dielectric having a high dielectric constant, such as a metal oxide, however, may not be stable during fabrication processes using relatively high temperatures. For example, a dopant activation anneal or a salicidation anneal for the source, the drain, and the gate of a MOSFET may be performed at temperatures over 1000° Celsius. At such a high temperature, a gate dielectric having a high dielectric constant may not be thermally stable. For example, tantalum oxide ($Ta_2O_5$), an example of a gate dielectric having a high dielectric constant, changes phase from being amorphous to being crystalline at temperatures above 800° Celsius. In a crystalline phase, tantalum oxide ($Ta_2O_5$) is undesirably leaky. In addition, at such a high temperature, a gate dielectric having a high dielectric constant may undesirably react with the silicon of the channel region of the MOSFET or the polysilicon of the gate of the MOSFET.

In the prior art, as discussed in the technical journal article with title *Sub-100 nm Gate Length Metal Gate NMOS Transistors Fabricated by a Replacement Gate Process* by A. Chatterjee et al., IEDM, 1997, pages 821–824, a metal gate electrode is fabricated with a gate dielectric having a high dielectric constant after any fabrication process using a relatively high temperature. However, such prior art uses only a single type of metal gate for both a P-channel MOSFET and an N-channel MOSFET.

Unfortunately, a single mid-band material such as metal for the gate electrode of both a P-channel MOSFET and an N-channel MOSFET is disadvantageous as the MOSFET is scaled down to submicron and nanometer dimensions. Short channel effects may become severe for a MOSFET having channel lengths of tens of nanometers when one type of metal gate is used for both the P-channel MOSFET and the N-channel MOSFET. In addition, a metal gate is disadvantageous because the metal from the gate may diffuse into the gate dielectric causing faster degradation of the gate dielectric having the high dielectric constant, or the metal from the gate may penetrate through the gate dielectric into the channel region of the MOSFET to further degrade the MOSFET reliability.

Nevertheless, further scaling down of MOSFET dimensions is desired. Thus, a process is desired which effectively fabricates N-channel MOSFETs and P-channel MOSFETs having dual gates for these two different MOSFETs with gate dielectrics of high dielectric constant. Dual gates for the two different types of MOSFETs alleviate short channel effects as the dimensions of the MOSFET are scaled down to tens of nanometers, and at the same time, such a process incorporates a gate dielectric of the high dielectric constant to replace the leaky gate oxide of thin dimensions.

For fabrication of dual gates for the P-channel MOSFET and the N-channel MOSFET, an amorphous semiconductor material, such as amorphous silicon, is deposited for forming the gate electrode, and the amorphous semiconductor material is doped with a P-type dopant for the P-channel MOSFET and with an N-type dopant for the N-channel MOSFET. After such doping of the amorphous semiconductor material of the gate, the amorphous semiconductor material is heated to activate the P-type dopant for the P-channel MOSFET and the N-type dopant for the N-channel MOSFET. To preserve the integrity of the gate dielectric having the high dielectric constant, it is desired to use a temperature that is as low as possible during such heating of the amorphous semiconductor material of the gate of the MOSFET.

SUMMARY OF THE INVENTION

Accordingly, in a general aspect of the present invention, a gate dielectric of high dielectric constant is used, and dual gates are fabricated for N-channel MOSFETs and P-channel MOSFETs while at the same time, the integrity of the gate dielectric having the high dielectric constant is preserved during fabrication of the dual gates for the N-channel MOSFET and the P-channel MOSFET. The gate dielectric having the high dielectric constant and dual gate electrodes of the N-channel MOSFET and the P-channel MOSFET are fabricated after any fabrication process using a relatively high temperature. In addition, the gate dielectric and the dual gate electrodes of the N-channel MOSFET and the P-channel MOSFET are fabricated using as low a temperature as possible to preserve the integrity of the gate dielectric having the high dielectric constant.

In a general aspect, the present invention is a method for fabricating a field effect transistor having a gate dielectric with a high dielectric constant and having a gate electrode. The method includes the step of fabricating the field effect transistor to have a drain and a source, and to have a sacrificial gate dielectric and a dummy gate electrode. Any fabrication process, such as the activation anneal or the salicidation anneal of the source and drain of the field effect transistor, using relatively high temperature is performed with the field effect transistor having the sacrificial gate dielectric and the dummy gate electrode. The present invention further includes the step of etching the dummy gate electrode and the sacrificial gate dielectric from the field effect transistor to form a gate opening having a sidewall of insulator material and having a bottom wall of a channel region of the field effect transistor.

The present invention also includes the steps of depositing a layer of dielectric with high dielectric constant on the side wall and the bottom wall of the gate opening. A crystallization enhancing layer is deposited on the layer of dielectric with the high dielectric constant at the bottom wall of the gate opening. Amorphous gate electrode material, such as amorphous silicon, is then deposited into the gate opening to fill the gate opening after the crystallization enhancing layer has been deposited.

Dual gates for both an N-channel field effect transistor and a P-channel field effect transistor are formed by doping the amorphous gate electrode material in the gate opening with an N-type dopant using a low energy implantation process when the field effect transistor is an N-channel field effect transistor, and by doping the amorphous gate electrode material in the gate opening with a P-type dopant using a low energy implantation process when the field effect transistor is a P-channel field effect transistor. The amorphous gate electrode material in the gate opening is then annealed at a relatively low temperature, such as 500° Celsius, using an enhanced crystallization process to convert the amorphous gate electrode material, such as amorphous silicon, into polycrystalline gate electrode material, such as polycrystalline silicon.

The crystallization enhancing layer, disposed between the layer of dielectric with the high dielectric constant and the amorphous gate electrode material, promotes crystallization of the amorphous gate electrode material into the polycrystalline gate electrode material such that the enhanced crystallization process is performed at a lower temperature than for a solid phase crystallization process without use of the crystallization enhancing layer.

In this manner, any fabrication process, such as the activation anneal or the salicidation anneal of the source and drain of the field effect transistor, using relatively high temperature is performed with the field effect transistor having the sacrificial gate dielectric and the dummy gate electrode before deposition of the gate dielectric having the high dielectric constant. During the activation anneal of the dopants in the dual gates of the N-channel MOSFET and the P-channel MOSFET, a relatively low temperature of 500° Celsius is used with the present invention. Thus, the integrity of the gate dielectric having the high dielectric constant is preserved with the present invention.

Furthermore, because the gate dielectric having the high dielectric constant is formed toward the end of the process for fabricating the MOSFET after the drain and the source of the MOSFET have been formed, the probability is lessened for contamination of critical device regions by the chemicals used for forming the gate dielectric having the high dielectric constant. In addition, dual gates for both the N-channel MOSFET and the P-channel MOSFET are fabricated to alleviate the short channel effects for MOSFETs having scaled down dimensions of tens of nanometers.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, and 12B refer to elements having similar structure and function.

DETAILED DESCRIPTION

In one aspect of the present invention, a P-channel MOSFET and an N-channel MOSFET are initially fabricated to each have a sacrificial gate dielectric and a dummy gate electrode. Any fabrication process using a relatively high temperature is performed with the P-channel MOSFET and the N-channel MOSFET having the sacrificial gate dielectric and the dummy gate electrode.

Figure 1A:
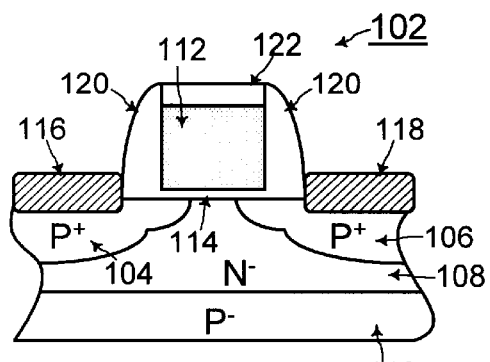
FIG. 1A shows a cross sectional view of a P-channel MOSFET having a sacrificial gate oxide and a dummy gate electrode.

Referring to FIG. 1A, a PMOSFET (P-channel Metal Oxide Semiconductor Field Effect Transistor) 102 includes a drain 104 and a source 106 fabricated within an N-well 108. The N-well 108 may be fabricated within a P-type semiconductor substrate 110. The PMOSFET 102 further includes a dummy gate electrode 112 and a sacrificial gate dielectric 114. The dummy gate electrode 112 may be comprised of polysilicon, and the sacrificial gate dielectric 114 may be comprised of silicon dioxide.

In addition, the PMOSFET 102 includes a drain salicide 116 formed on the drain 104 for allowing contact to the drain 104 and includes a source salicide 118 formed on the source 106 for allowing contact to the source 106. Spacers 120 comprised of insulator material such as silicon dioxide surround the dummy gate electrode 112. A BARC (Bottom Anti-Reflective Coating) layer 122, which may be comprised of silicon oxynitride (SiON), may be present above the dummy gate electrode 112 when the BARC layer 122 is used during the patterning of the dummy gate electrode 112 for improved photolithography resolution.

Figure 1B:
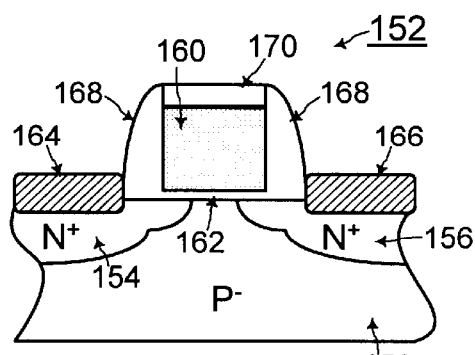
FIG. 1B shows a cross sectional view of an N-channel MOSFET having a sacrificial gate oxide and a dummy gate electrode.

Similarly, referring to FIG. 1B, an NMOSFET (N-channel Metal Oxide Semiconductor Field Effect Transistor) 152 includes a drain 154 and a source 156 fabricated within an P-well 158 which may be the P-type semiconductor substrate 110 of FIG. 1A. The NMOSFET 152 further includes a dummy gate electrode 160 and a sacrificial gate dielectric 162. The dummy gate electrode 160 may be comprised of polysilicon, and the sacrificial gate dielectric 162 may be comprised of silicon dioxide.

In addition, the NMOSFET 152 includes a drain salicide 164 formed on the drain 154 for allowing contact to the drain 154 and includes a source salicide 166 formed on the source 156 for allowing contact to the source 156. Spacers 168 comprised of insulator material such as silicon dioxide surround the dummy gate electrode 160. A BARC (Bottom Anti-Reflective Coating) layer 170, which may be comprised of silicon oxynitride (SiON), may be present above the dummy gate electrode 160 when the BARC layer 170 is used during the patterning of the dummy gate electrode 160 for improved photolithography resolution.

Any fabrication process that uses a relatively high temperature is performed with the PMOSFET 102 and the NMOSFET 152 having the respective dummy gate electrode and the respective sacrificial gate dielectric. For example, an activation anneal for activating the dopants within the respective drain and the respective source of the PMOSFET 102 and the NMOSFET 152 is performed at a relatively high temperature of over 1000° Celsius. In addition, a salicidation anneal for forming the respective drain salicide and the respective source salicide of the PMOSFET 102 and the NMOSFET 152 is also performed at a relatively high temperature of over 1000° Celsius.

The fabrication processes that use such high temperatures are performed with the PMOSFET 102 and the NMOSFET 152 having the respective dummy gate electrode and the respective sacrificial gate dielectric. The respective sacrificial gate dielectric 114 and 162 of the PMOSFET 102 and the NMOSFET 152, respectively, which may be comprised of silicon dioxide is amenable for fabrication processes that use such high temperatures.

Figure 2A:
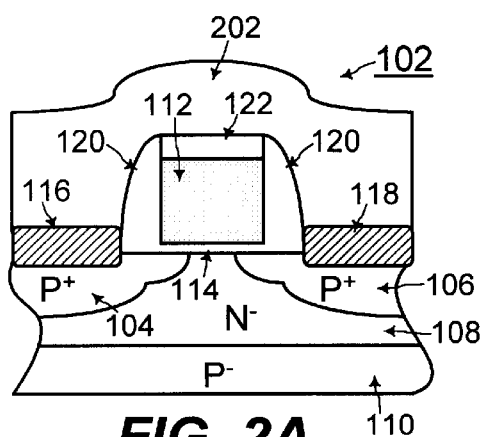
FIG. 2A and FIG. 2B show a cross sectional view of FIG. 1A and 1B, respectively, with a layer of insulator material, such as silicon dioxide, deposited to surround the dummy gate electrode of the P-channel MOSFET and the N-channel MOSFET, respectively, according to one embodiment of the present invention.
Figure 2B:
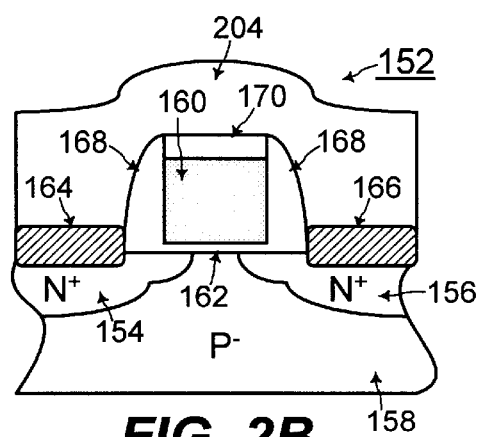

After performing the fabrication processes that use such high temperatures with the respective dummy gate electrode and the respective sacrificial gate dielectric for the PMOSFET 102 and the NMOSFET 152, a gate dielectric having a high dielectric constant replaces the sacrificial gate dielectric. Referring to FIG. 2A, a layer of insulator material 202 is deposited to surround the dummy gate electrode 112 for the PMOSFET 102. Similarly, referring to FIG. 2B, a layer of insulator material 204 is deposited to surround the dummy gate electrode 160 for the NMOSFET 152. The layer of insulator material 202 and 204 for the PMOSFET 102 and the NMOSFET 152, respectively, may be comprised of silicon dioxide, and fabrication processes for deposition of such a layer of insulator material is known to one of ordinary skill in the art of integrated circuit fabrication.

Figure 3A:
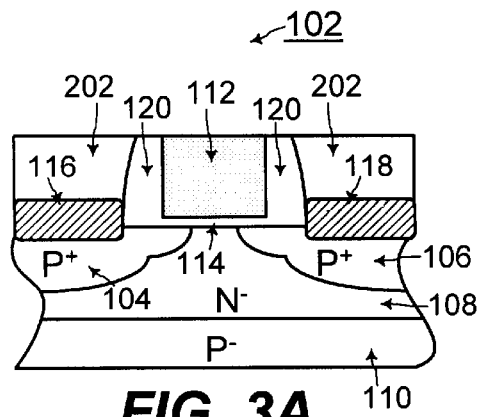
FIG. 3A and FIG. 3B show a cross sectional view of FIG. 2A and 2B, respectively, with polishing down of the layer of insulator material until the dummy gate electrode is exposed in the P-channel MOSFET and the N-channel MOSFET, respectively, according to one embodiment of the present invention.

Referring to FIG. 3A, the layer of insulator material 202 is polished down until the dummy gate electrode 112 of the PMOSFET 102 is exposed. Similarly, referring to FIG. 3B, the layer of insulator material 204 is polished down until the dummy gate electrode 160 for the NMOSFET 152 is exposed. Polishing processes such as CMP (Chemical Mechanical Polishing) for polishing down the layer of insulator material 202 and 204 are known to one of ordinary skill in the art of integrated circuit fabrication.

Figure 4A:
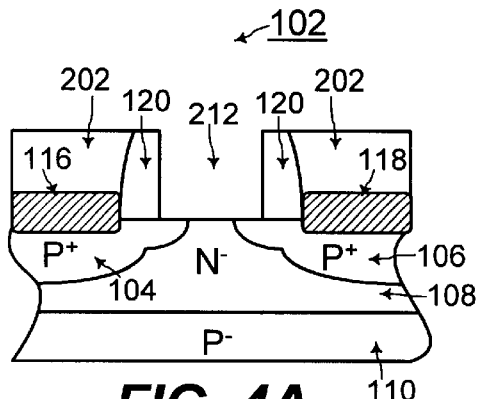
FIG. 4A and FIG. 4B show a cross sectional view of FIG. 3A and 3B, respectively, with etching of the dummy gate electrode and the sacrificial oxide to form a gate opening for the P-channel MOSFET and the N-channel MOSFET, respectively, according to one embodiment of the present invention.

Referring to FIG. 3A and FIG. 4A, the dummy gate electrode 112 of the PMOSFET 102 that is exposed is selectively etched away. In addition, the sacrificial gate dielectric 114 of the PMOSFET 102 is also etched away to form a gate opening 212. The gate opening 212 has side walls of the insulator material from the spacers 120 or the layer of insulator material 202. The gate opening 212 has a bottom wall of the channel region of the PMOSFET 102. Selective etching processes for etching away the dummy gate electrode 112 and the sacrificial gate dielectric 114 are known to one of ordinary skill in the art of integrated circuit fabrication.

Figure 3B:
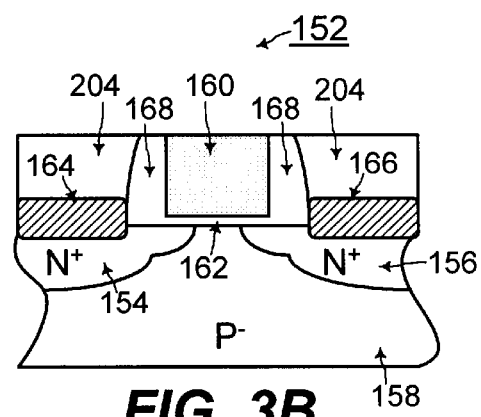
Figure 4B:
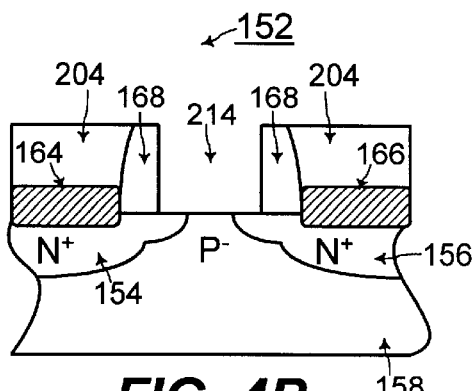

Similarly, referring to FIG. 3B and FIG. 4B, the dummy gate electrode 160 of the NMOSFET 152 that is exposed is selectively etched away. In addition, the sacrificial gate dielectric 162 of the NMOSFET 152 is also etched away to form a gate opening 214. The gate opening 214 has side walls of the insulator material from the spacers 168 or the layer of insulator material 204. The gate opening 214 has a bottom wall of the channel region of the NMOSFET 152. Selective etching processes for etching away the dummy gate electrode 160 and the sacrificial gate dielectric 162 are known to one of ordinary skill in the art of integrated circuit fabrication.

Figure 5A:
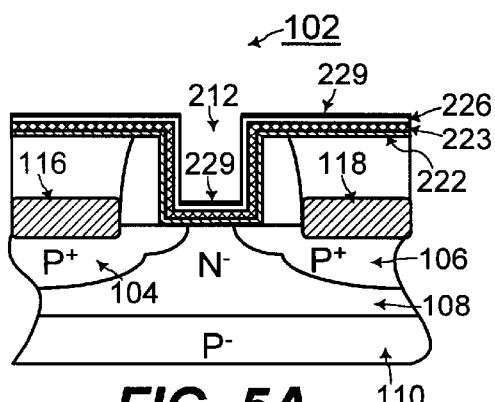
FIG. 5A and FIG. 5B show a cross sectional view of FIG. 4A and 4B, respectively, with deposition of a nitrided oxide layer, a gate dielectric having a high dielectric constant, and a reaction barrier layer on the side wall and bottom wall, and a crystallization enhancing layer on the bottom wall, of the gate opening of the P-channel MOSFET and the N-channel MOSFET, respectively, according to one embodiment of the present invention.

Referring to FIG. 5A, a layer of nitrided oxide (SiON) 222 is deposited on the side walls and the bottom wall of the gate opening 212 for the PMOSFET 102. Then a layer of dielectric with a high dielectric constant 223 is deposited on the layer of nitrided oxide 222 on the side walls and the bottom wall of the gate opening 212 for the PMOSFET 102. Similarly, referring to FIG. 5B, a layer of nitrided oxide (SiON) 224 is deposited on the side walls and the bottom wall of the gate opening 214 for the NMOSFET 152. Then a layer of dielectric with a high dielectric constant 225 is deposited on the layer of nitrided oxide 224 on the side walls and the bottom wall of the gate opening 214 for the NMOSFET 152.

The layer of dielectric with the high dielectric constant 223 and 225 may be a metal oxide such as tantalum oxide ($Ta_2O_5$). The layer of nitrided oxide 224 and 225 may or may not be deposited with the present invention. When the layer of nitrided oxide 224 and 225 is deposited, such a layer is an interface layer between the channel region of the MOSFET and the layer of dielectric with the high dielectric constant 223 and 225. Some gate dielectrics with the high dielectric constant do not smoothly interface with the semiconductor forming the channel region of the MOSFET. For such gate dielectrics, the layer of nitrided oxide 224 and 225 is deposited to smoothly interface the gate dielectric with the high dielectric constant to the semiconductor forming the channel region of the MOSFET. Processes for depositing the layer of nitrided oxide 222 and 224 and the layer of gate dielectric with the high dielectric constant 223 and 225 are known to one of ordinary skill in the art of integrated circuit fabrication.

Figure 6A:
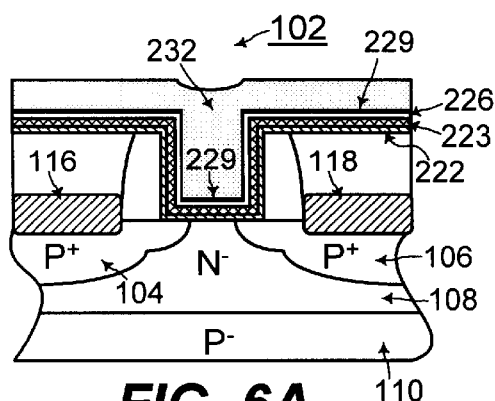
FIG. 6A and FIG. 6B show a cross sectional view of FIG. 5A and 5B, respectively, with deposition of an amorphous gate electrode material, such as amorphous silicon, to fill the gate opening of the P-channel MOSFET and the N-channel MOSFET, respectively, according to one embodiment of the present invention.

Referring to FIG. 5A, after deposition of the gate dielectric with the high dielectric constant 223, a reaction barrier layer 226 may be deposited on the gate dielectric with the high dielectric constant 223 on the side wall and the bottom wall of the gate opening 212 of the PMOSFET 102. Referring to FIG. 5A, a crystallization enhancing layer 229 is deposited on the reaction barrier layer 226 on the bottom wall of the gate opening 212 and above the insulator material 120 and 202 for the PMOSFET 102. Referring to FIG. 6A, after deposition of the crystallization enhancing layer 229, amorphous gate electrode material 232, such as amorphous silicon, is deposited to fill the gate opening 212 for the PMOSFET 102.

The reaction barrier layer 226 is disposed between the gate dielectric with the high dielectric constant 223 and the amorphous gate electrode material 232, or between the gate dielectric with the high dielectric constant 223 and the crystallization enhancing layer 229. The reaction barrier layer 226 is comprised of a material, such as silicon nitride (SiN or $Si_3N_4$), that is amenable for preventing a reaction between the gate dielectric with the high dielectric constant 223 and the amorphous gate electrode material 232, or between the gate dielectric with the high dielectric constant 223 and the crystallization enhancing layer 229. The present invention may be practiced with or without the reaction barrier layer 226 depending on the reactivity of the gate dielectric with the high dielectric constant 223 with the amorphous gate electrode material 232 or with the crystallization enhancing layer 229.

Figure 5B:
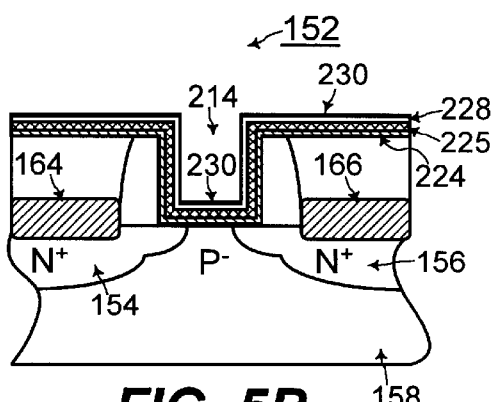
Figure 6B:
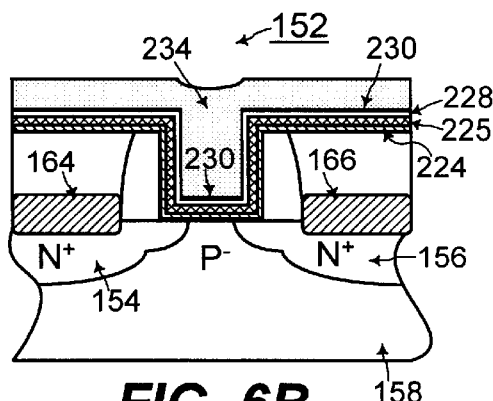

Similarly, referring to FIG. 5B, after deposition of the gate dielectric with the high dielectric constant 225, a reaction barrier layer 228 may be deposited on the gate dielectric with the high dielectric constant 225 on the side wall and the bottom wall of the gate opening 214 of the NMOSFET 152. Referring to FIG. 5B, a crystallization enhancing layer 230 is deposited on the reaction barrier layer 228 on the bottom wall of the gate opening 214 and above the insulator material 168 and 204 for the NMOSFET 152. Referring to FIG. 6B, after deposition of the crystallization enhancing layer 230, amorphous gate electrode material 234, such as amorphous silicon, is deposited to fill the gate opening 214 for the NMOSFET 152. The reaction barrier layer 228 is disposed between the gate dielectric with the high dielectric constant 225 and the amorphous gate electrode material 234, or between the gate dielectric with the high dielectric constant 225 and the crystallization enhancing layer 230. The reaction barrier layer 228 is comprised of a material, such as silicon nitride (SiN or $Si_3N_4$), that is amenable for preventing a reaction between the gate dielectric with the high dielectric constant 225 and the amorphous gate electrode material 234, or between the gate dielectric with the high dielectric constant 225 and the crystallization enhancing layer 230. The present invention may be practiced with or without the reaction barrier layer 228 depending on the reactivity of the gate dielectric with the high dielectric constant 225 with the amorphous gate electrode material 234 or with the crystallization enhancing layer 230.

Processes for deposition of reaction barrier layer 226 and 228, which may be silicon nitride, and the amorphous gate electrode material 232 and 234, which may be amorphous silicon, are known to one of ordinary skill in the art of integrated circuit fabrication. In addition, processes, such as metal sputtering, for deposition of the crystallization enhancing layer 229 and 230, which typically is a metal such as nickel, are known to one of ordinary skill in the art of integrated circuit fabrication.

Figure 7A:
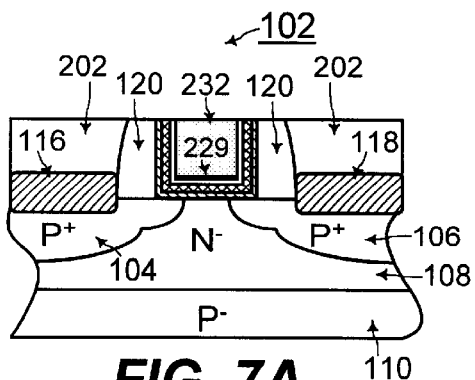
FIG. 7A and FIG. 7B show a cross sectional view of FIG. 6A and 6B, respectively, with polishing down of the amorphous gate electrode material such that the amorphous gate electrode material is contained within the gate opening of the P-channel MOSFET and the N-channel MOSFET, respectively, according to one embodiment of the present invention.

Referring to FIG. 6A, the amorphous gate electrode material 232 may be deposited above the insulator material 120 and 202 surrounding the gate opening 212 for the PMOSFET 102. Referring to FIG. 7A, the amorphous gate electrode material 232 above the insulator material 120 and 202 surrounding the gate opening 212 is polished down such that the amorphous gate electrode material 232 is contained within the gate opening 212 for the PMOSFET 102.

Figure 7B:
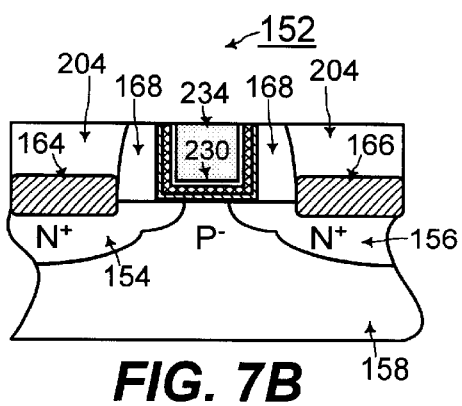

Referring to FIG. 6B, the amorphous gate electrode material 234 may be deposited above the insulator material 168 and 204 surrounding the gate opening 214 for the NMOSFET 152. Referring to FIG. 7B, the amorphous gate electrode material 234 above the insulator material 168 and 204 surrounding the gate opening 214 is polished down such that the amorphous gate electrode material 234 is contained within the gate opening 214 for the NMOSFET 152. Polishing processes such as CMP (Chemical Mechanical Polishing) for polishing down the amorphous gate electrode material 232 and 234 are known to one of ordinary skill in the art of integrated circuit fabrication.

Figure 8A:
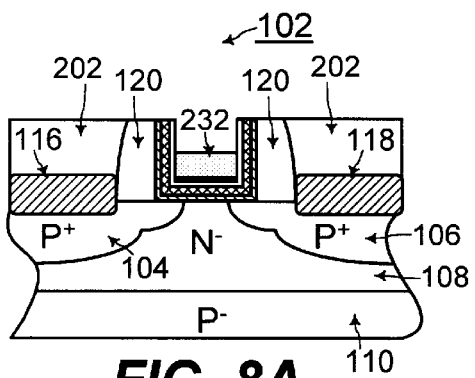
FIG. 8A and FIG. 8B show a cross sectional view of FIG. 7A and 7B, respectively, with etching away a portion of the amorphous gate electrode material within the gate opening to define the thickness of a remaining portion of the amorphous gate electrode material within the gate opening of the P-channel MOSFET and the N-channel MOSFET, respectively, according to one embodiment of the present invention.

Referring to FIG. 7A and FIG. 8A, a portion of the amorphous gate electrode material 232 is etched away from the gate opening 212 to define a thickness of a remaining portion of the amorphous gate electrode material 232 within the gate opening 212 for the PMOSFET 102. The remaining portion of the amorphous gate electrode material 232 within the gate opening 212 forms the gate electrode of the PMOSFET 102. The thickness of the remaining portion of the amorphous gate electrode material 232 within the gate opening 212 determines the work function of the gate electrode and thus the threshold voltage of the PMOSFET 102.

Figure 8B:
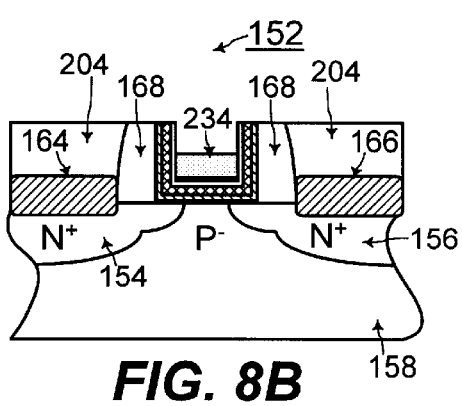

Similarly, referring to FIG. 7B and 8B, a portion of the amorphous gate electrode material 234 is etched away from the gate opening 214 to define a thickness of a remaining portion of the amorphous gate electrode material 234 within the gate opening 214 for the NMOSFET 152. The remaining portion of the amorphous gate electrode material 234 within the gate opening 214 forms the gate electrode of the NMOSFET 152. The thickness of the remaining portion of the amorphous gate electrode material 234 within the gate opening 214 determines the work function of the gate electrode and thus the threshold voltage of the NMOSFET 152. Processes for etching away a portion of the amorphous gate electrode material are known to one of ordinary skill in the art of integrated circuit fabrication.

Figure 9A:
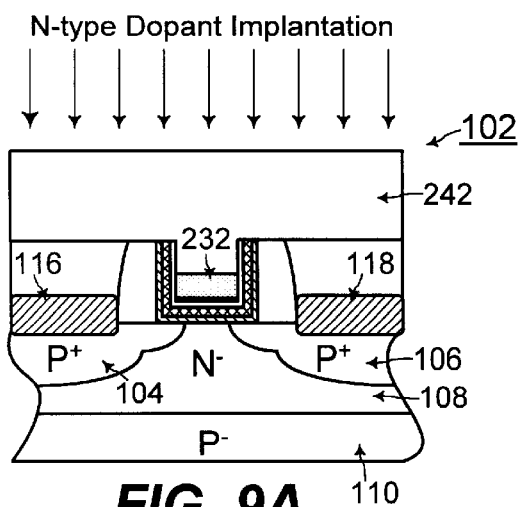
FIG. 9A and FIG. 9B show a cross sectional view of FIG. 8A and 8B, respectively, with doping of the amorphous gate electrode material within the gate opening with an N-type dopant for only the N-channel MOSFET, according to one embodiment of the present invention.
Figure 9B:
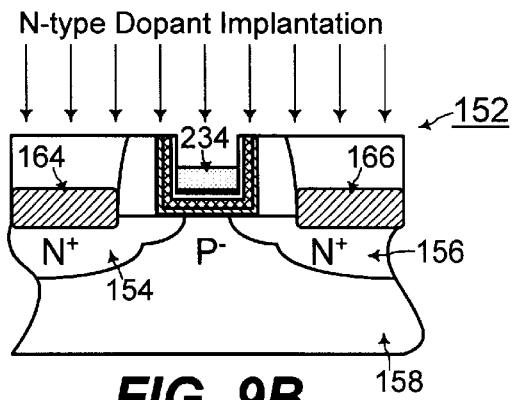

Dual gates are formed for the PMOSFET 102 and the NMOSFET 152 by doping the amorphous gate electrode material 232 and 234 with different dopants for the PMOSFET 102 and the NMOSFET 152. Referring to FIG. 9A and FIG. 9B, the remaining portion of the amorphous gate electrode material 234 within the gate opening 214 for the NMOSFET 152 is doped with an N-type dopant such as phosphorous. Referring to FIG. 9A, a photoresist layer 242 is deposited over the PMOSFET 102 such that the N-type dopant is implanted into the remaining portion of the amorphous gate electrode material 234 within the gate opening 214 of only the NMOSFET 152.

Figure 10A:
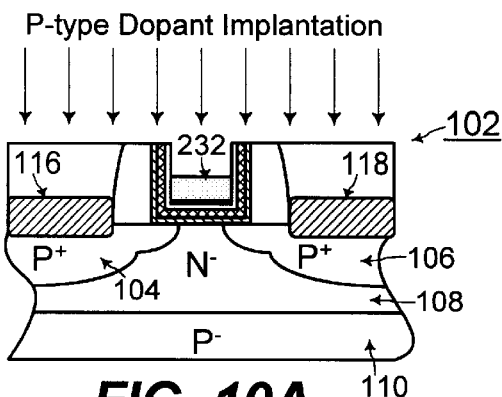
FIG. 10A and FIG. 10B show a cross sectional view of FIG. 9A and 9B, respectively, with doping of the amorphous gate electrode material within the gate opening with a P-type dopant for only the P-channel MOSFET, according to one embodiment of the present invention.
Figure 10B:
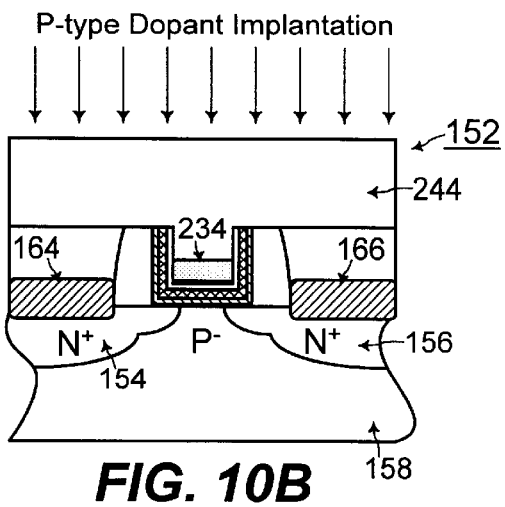

Similarly, referring to FIG. 10A and FIG. 10B, the remaining portion of the amorphous gate electrode material 232 within the gate opening 212 for the PMOSFET 102 is doped with a P-type dopant such as boron. Referring to FIG. 10B, a photoresist layer 244 is deposited over the NMOSFET 152 such that the P-type dopant is implanted into the remaining portion of the amorphous gate electrode material 232 within the gate opening 212 of only the PMOSFET 102.

The N-type dopant is implanted into the remaining portion of the amorphous gate electrode material 234 within the gate opening 214 of the NMOSFET 152, and the P-type dopant is implanted into the remaining portion of the amorphous gate electrode material 232 within the gate opening 212 of the PMOSFET 102, using a low energy implantation process as known to one of ordinary skill in the art. After such an implantation of the N-type dopant for the NMOSFET 152 and the P-type dopant for the PMOSFET 102, any photoresist layer 242 and 244 is removed, and an anneal process is performed for the remaining portion of the amorphous gate electrode material 232 and 234 for the PMOSFET 102 and the NMOSFET 152, respectively.

Such an anneal process converts the amorphous gate electrode material, such as amorphous silicon, to a polycrystalline gate electrode material, such as polycrystalline silicon. In addition, such an anneal process activates the N-type dopant within the gate electrode for the NMOSFET 152 and the P-type dopant within the gate electrode for the PMOSFET 102. With low energy implantation of the N-type dopant for the NMOSFET 152 and the P-type dopant for the PMOSFET 102 and with use of the crystallization enhancing layer 229 and 230, an enhanced crystallization process, as known to one of ordinary skill in the art of integrated circuit fabrication, is used for the anneal process. An example of such an enhanced crystallization process is a (MIC) metal induced crystallization process when the crystallization enhancing layer 229 and 230 is comprised of a metal such as nickel, with a relatively low temperature of approximately 500° Celsius.

With use of such an enhanced crystallization process, the crystallization enhancing layer 229 and 230 disposed adjacent the amorphous gate electrode material, promotes crystallization of the amorphous gate electrode material into the polycrystalline gate electrode material such that the enhanced crystallization process is performed at a lower temperature (such as 500° Celsius) than for a solid phase crystallization process (such as 600° Celsius) without use of a crystallization enhancing layer.

In this manner, fabrication processes after deposition of the gate dielectric having the high dielectric constant use as low a temperatures as possible such that the integrity of such a gate dielectric is preserved. Any fabrication processes using relatively high temperatures, such as an activation anneal and a salicidation anneal of the drain and source of the MOSFET is performed with the sacrificial gate dielectric 114 and 162 and the dummy gate electrode 112 and 160 before the deposition of the gate dielectric having the high dielectric constant.

Furthermore, because the gate dielectric having the high dielectric constant is formed toward the end of the process for fabricating the MOSFET after the drain and the source of the MOSFET have been formed, the probability is lessened for contamination of critical device regions by the chemicals used for forming the gate dielectric having the high dielectric constant. In addition, dual gates are fabricated for the PMOSFET 102 and the NMOSFET 152 with the gate electrode 232 of the PMOSFET 102 being implanted with a P-type dopant and with the gate electrode 234 of the NMOSFET 152 being implanted with an N-type dopant. With such dual gates, adverse short channel effects may be more easily alleviated for MOSFETs having scaled down dimensions of tens of nanometers.

Figure 11A:
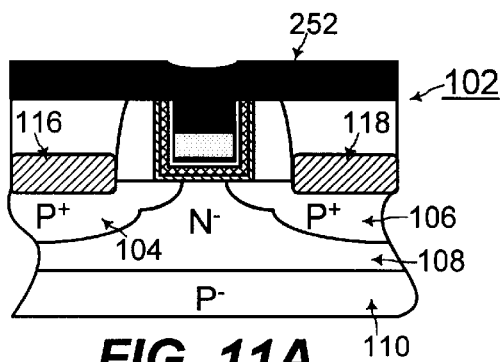
FIG. 11A and FIG. 11B show a cross sectional view of FIG. 10A and 10B, respectively, with deposition of a metal contact onto the gate electrode material, within the gate opening, that has been annealed to a polycrystalline form for the P-channel MOSFET and the N-channel MOSFET, respectively, according to one embodiment of the present invention.

Referring to FIG. 11A, a metal contact 252 is deposited on the polycrystalline gate electrode material 232 for the PMOSFET 102. Similarly, referring to FIG. 11B, a metal contact 254 is deposited on the polycrystalline gate material 234 for the NMOSFET 152. The metal contact 252 and 254 for the PMOSFET 102 and the NMOSFET 152, respectively, reduces the sheet resistance of the gate to lower the effective gate resistance of the PMOSFET 102 and the NMOSFET 152. Such lowering of the effective gate resistance advantageously leads to higher device operating speeds. Processes for depositing the metal contact 252 and 254 are known to one of ordinary skill in the art of integrated circuit fabrication.

Figure 12A:
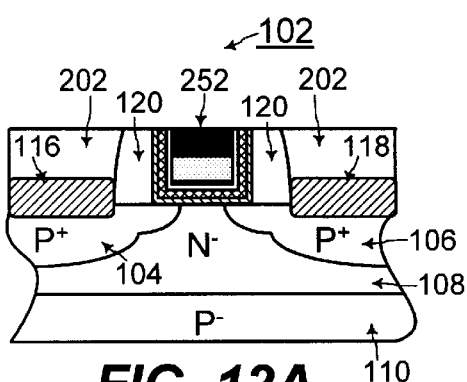
FIG. 12A and FIG. 12B show a cross sectional view of FIG. 11A and 11B, respectively, with polishing down of the metal contact such that the metal contact is contained within the gate opening for the P-channel MOSFET and the N-channel MOSFET, respectively, according to one embodiment of the present invention.

Referring to FIG. 11A, the metal contact 252 is also deposited onto the insulator material 120 and 202 surrounding the gate opening 212 of the PMOSFET 102. Referring to FIG. 12A, the metal contact 252 on the insulator material 120 and 202 surrounding the gate opening 212 is polished down such that the metal contact is contained within the gate opening 212 of the PMOSFET 102.

Figure 11B:
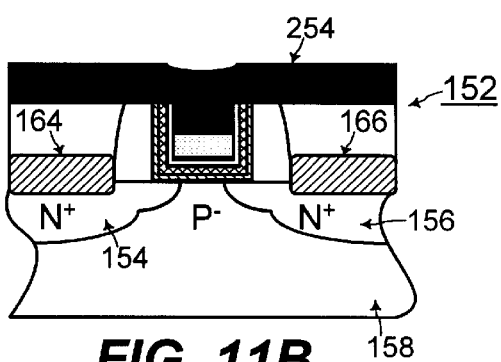
Figure 12B:
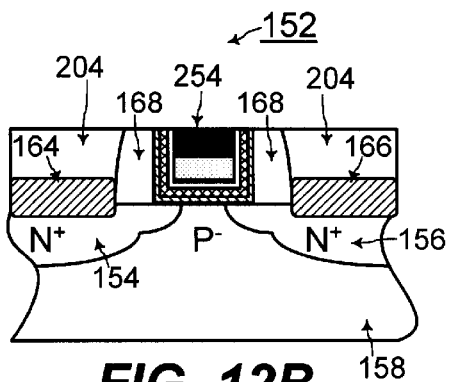

Similarly, referring to FIG. 11B, the metal contact 254 is also deposited onto the insulator material 168 and 204 surrounding the gate opening 214 of the NMOSFET 152. Referring to FIG. 12B, the metal contact 254 on the insulator material 168 and 204 surrounding the gate opening 214 is polished down such that the metal contact is contained within the gate opening 214 of the NMOSFET 152. Polishing processes such as CMP (Chemical Mechanical Polishing) for polishing down the metal contact 252 and 254 are known to one of ordinary skill in the art of integrated circuit fabrication. The metal contact 252 within the gate opening 212 of the PMOSFET 102 and the metal contact 254 within the gate opening 214 of the NMOSFET 254 may be further coupled to other integrated circuit components.

The foregoing is by way of example only and is not intended to be limiting. For example, other types of amorphous semiconductor material, aside from just the example of amorphous silicon, may be used for the gate electrode material. Any type of amorphous semiconductor material which is amenable for forming a gate electrode of a MOSFET and which is amenable to a solid phase crystallization process for conversion into a polycrystalline form at a relatively low temperature may be used with the present invention, as would be apparent to one of ordinary skill in the art from the description herein. In addition, the present invention may be used for fabricating a gate dielectric with a high dielectric constant and for fabricating dual gates for any type of field effect transistor aside from just the example of a MOSFET (Metal Oxide Semiconductor Field Effect Transistor).

Furthermore, as will be understood by those skilled in the art, the integrated circuit structures described herein may be made or used in the same way regardless of their position and orientation. Accordingly, it is to be understood that terms and phrases such as "on," "onto," "side wall," "bottom wall," "above," and "below" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for fabricating a field effect transistor having a gate dielectric with a high dielectric constant and having a gate electrode, the method including the steps of:

A. fabricating said field effect transistor to have a drain and a source, and to have a sacrificial gate dielectric and a dummy gate electrode, wherein any fabrication process using relatively high temperature is performed with said field effect transistor having said sacrificial gate dielectric and said dummy gate electrode;

B. etching said dummy gate electrode and said sacrificial gate dielectric from said field effect transistor to form a gate opening having a sidewall of insulator material and having a bottom wall of a channel region of said field effect transistor;

C. depositing a layer of dielectric with high dielectric constant on said side wall and said bottom wall of said gate opening;

D. depositing a crystallization enhancing layer on said layer of dielectric with said high dielectric constant on said bottom wall of said gate opening;

E. depositing amorphous gate electrode material into said gate opening to fill said gate opening after said step D;

F. doping said amorphous gate electrode material in said gate opening with an N-type dopant using a low energy implantation process when said field effect transistor is an N-channel field effect transistor, and doping said amorphous gate electrode material in said gate opening with a P-type dopant using a low energy implantation process when said field effect transistor is a P-channel field effect transistor; and G. annealing said amorphous gate electrode material in said gate opening after said step F at a relatively low temperature using an enhanced crystallization process to convert said amorphous gate electrode material into polycrystalline gate electrode material;

and wherein said crystallization enhancing layer, disposed between said layer of dielectric with said high dielectric constant and said amorphous gate electrode material, promotes crystallization of said amorphous gate electrode material into said polycrystalline gate electrode material such that said enhanced crystallization process is performed at a lower temperature than for a solid phase crystallization process without use of said crystallization enhancing layer.

2. The method of claim 1, wherein said crystallization enhancing layer is comprised of a metal.

3. The method of claim 2, wherein said crystallization enhancing layer is comprised of a nickel.

4. The method of claim 1, further including the step of:

depositing a reaction barrier layer between said layer of dielectric with said high dielectric constant and said crystallization enhancing layer, wherein said reaction barrier layer prevents reaction between said layer of dielectric with said high dielectric constant and one of said crystallization enhancing layer and said gate electrode material filled within said gate opening.

5. The method of claim 4, wherein said reaction barrier layer is comprised of silicon nitride.

6. The method of claim 1, wherein said field effect transistor is fabricated within a silicon semiconductor substrate, and wherein said channel region of said field effect transistor is part of said silicon semiconductor substrate, and wherein said method further includes the step of:

depositing a layer of oxide on the side wall and the bottom wall of said gate opening before said step C such that said layer of oxide is an interface layer between said channel region of said field effect transistor and said layer of dielectric having said high dielectric constant.

7. The method of claim 6, wherein said layer of oxide is a layer of nitrided oxide.

8. The method of claim 1, wherein said amorphous gate electrode material is amorphous silicon, and wherein said enhanced crystallization process converts said amorphous silicon into polycrystalline silicon.

9. The method of claim 1, wherein said step B further includes the steps of:

depositing a layer of insulator material for surrounding said dummy gate electrode;

polishing down said layer of insulator material until said dummy gate electrode is exposed; and etching away said dummy gate electrode and said sacrificial gate dielectric that is disposed below said dummy gate electrode to form said gate opening.

10. The method of claim 9, wherein said field effect transistor is fabricated within a silicon semiconductor substrate, and wherein said layer of insulator material that surrounds said dummy gate electrode is a layer of silicon dioxide.

11. The method of claim 9, wherein said amorphous gate electrode material deposited to fill said gate opening in said step C is also deposited above said layer of insulator material, the method further including the steps of:

polishing down said amorphous gate electrode material deposited above said layer of insulator material such that said amorphous gate electrode material is contained within said gate opening; and etching a portion of said amorphous gate electrode material within said gate opening for defining a thickness of a remaining portion of said amorphous gate electrode material that forms said gate electrode of said field effect transistor within said gate opening, before said step F.

12. The method of claim 1, wherein said step F further includes the steps of:

depositing a photoresist layer over any P-channel field effect transistor when doping said amorphous gate electrode material within said gate opening of any N-channel field effect transistor with said N-type dopant; and depositing a photoresist layer over any N-channel field effect transistor when doping said amorphous gate electrode material within said gate opening of any P-channel field effect transistor with said P-type dopant.

13. The method of claim 1, further including the step of:
depositing a metal contact on said polycrystalline gate electrode material within said gate opening, after said step G.

14. The method of claim 1, wherein said dielectric having said high dielectric constant is a metal oxide.

15. The method of claim 14, wherein said dielectric having said high dielectric constant is tantalum oxide ($Ta_2O_5$).

16. The method of claim 1, wherein said step G of annealing said amorphous gate electrode material using said enhanced crystallization process is performed at a temperature of approximately 500° Celsius.

17. The method of claim 1, wherein processes for an activation anneal and a salicidation anneal of said source and said drain of said field effect transistor using relatively high temperature are performed in said step A with said field effect transistor having said sacrificial gate dielectric and said dummy gate electrode.

18. A method for fabricating a MOSFET (Metal Oxide Semiconductor Field Effect Transistor) having a gate dielectric with a high dielectric constant and having a gate electrode, said MOSFET being fabricated on a silicon semiconductor substrate, the method including the steps of:

A. fabricating said MOSFET to have a drain and a source, and to have a sacrificial gate oxide and a dummy polysilicon gate, wherein processes for an activation anneal and a salicidation anneal of said source and said drain of said MOSFET using relatively high temperature is performed with said MOSFET having said sacrificial gate oxide and said dummy polysilicon gate;

B. depositing a layer of silicon dioxide for surrounding said dummy polysilicon gate;

C. polishing down said layer of silicon dioxide until said dummy polysilicon gate is exposed;

D. etching away said dummy polysilicon gate and said sacrificial gate oxide that is disposed below said dummy polysilicon gate to form a gate opening having a sidewall of silicon dioxide and having a bottom wall of a channel region of said MOSFET, said channel region of said MOSFET being within said silicon semiconductor substrate;

E. depositing a layer of nitrided oxide on the side wall and the bottom wall of said gate opening;

F. depositing a layer of metal oxide with a high dielectric constant on said layer of nitrided oxide that has been deposited on said side wall and said bottom wall of said gate opening, said layer of nitrided oxide being an interface layer between said channel region of said MOSFET and said layer of metal oxide having said high dielectric constant;

G. depositing a reaction barrier layer of silicon nitride on said layer of metal oxide having said high dielectric constant on said side wall and said bottom wall of said gate opening;

H. depositing a crystallization enhancing layer of nickel on said layer of reaction barrier layer of silicon nitride on said bottom wall of said gate opening;

I. depositing amorphous silicon into said gate opening, and wherein said amorphous silicon deposited to fill said gate opening is also deposited above said layer of silicon dioxide surrounding said gate opening;

and wherein said reaction barrier layer, disposed between said layer of metal oxide having said high dielectric constant and said crystallization enhancing layer of nickel, prevents reaction between said layer of metal oxide and one of said crystallization enhancing layer of nickel and said amorphous silicon;

J. polishing down said amorphous silicon deposited above said layer of silicon dioxide surrounding said gate opening such that said amorphous silicon is contained within said gate opening;

K. etching a portion of said amorphous silicon within said gate opening for defining a thickness of a remaining portion of said amorphous silicon that forms said gate electrode of said MOSFET within said gate opening;

L. doping said remaining portion of said amorphous silicon in said gate opening with an N-type dopant using a low energy implantation process when said MOSFET is an N-channel MOSFET, and doping said remaining portion of said amorphous silicon in said gate opening with a P-type dopant using a low energy implantation process when said MOSFET is a P-channel MOSFET, wherein said step L further includes the steps of:

depositing a photoresist layer over any P-channel MOSFET when doping said remaining portion of said amorphous silicon within said gate opening of any N-channel MOSFET with said N-type dopant; and depositing a photoresist layer over any N-channel MOSFET when doping said remaining portion of said amorphous silicon within said gate opening of any P-channel MOSFET with said P-type dopant;

M. annealing said remaining portion of said amorphous silicon in said gate opening at a relatively low temperature of approximately 500° Celsius using an enhanced crystallization process to convert said amorphous silicon into polycrystalline silicon;

and wherein said crystallization enhancing layer of nickel, disposed between said reaction barrier layer of silicon nitride layer and said amorphous gate electrode material, promotes crystallization of said amorphous gate electrode material into said polycrystalline gate electrode material such that said enhanced crystallization process is performed at a lower temperature than for a solid phase crystallization process without use of said crystallization enhancing layer; and N. depositing a metal contact on said polycrystalline silicon within said gate opening.

* * * * *